(12) United States Patent
Kim

(10) Patent No.: US 7,535,173 B2
(45) Date of Patent: May 19, 2009

(54) PLASMA DISPLAY MODULE

(75) Inventor: Dae-Gyu Kim, Cheonan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 758 days.

(21) Appl. No.: 10/965,222

(22) Filed: Oct. 15, 2004

(65) Prior Publication Data

US 2005/0111175 A1 May 26, 2005

(30) Foreign Application Priority Data

Oct. 16, 2003 (KR) .................... 10-2003-0072148

(51) Int. Cl.
*H01J 17/49* (2006.01)
*H01J 9/00* (2006.01)

(52) U.S. Cl. ........................ 313/582; 445/24

(58) Field of Classification Search ......... 313/582–587; 315/169.4; 361/679, 681, 748; 349/58; 312/223.1, 312/223.5, 223.6; 445/24
See application file for complete search history.

(56) References Cited

U.S. PATENT DOCUMENTS

| | | | |
|---|---|---|---|
| 5,261,826 A | 11/1993 | Leeb | |
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Sinoda et al. | |
| 5,724,054 A | 3/1998 | Shinoda | |
| 5,786,794 A | 7/1998 | Kishi et al. | |
| 5,952,782 A | 9/1999 | Nanto | |
| RE37,444 E | 11/2001 | Kanazawa | |
| 6,630,916 B1 | 10/2003 | Shinoda | |
| 6,707,436 B2 | 3/2004 | Setoguchi et al. | |
| 2003/0020152 A1* | 1/2003 | Inoue et al. | 257/684 |

FOREIGN PATENT DOCUMENTS

| | | |
|---|---|---|
| CN | 1402319 | 3/2003 |
| JP | 02-148645 | 6/1990 |
| JP | 10-143083 | 5/1998 |
| JP | 2845183 | 10/1998 |
| JP | 2917279 | 4/1999 |
| JP | 11-177258 | 7/1999 |

(Continued)

OTHER PUBLICATIONS

Korean Office Action of the Korean Patent Application No. 2004-72148, mailed on Mar. 29, 2006.
*Office action* from the Japanese Patent Office issued in Applicant's corresponding Japanese Patent Application No. 2004-299027 dated Aug. 29, 2006.

(Continued)

*Primary Examiner*—Toan Ton
*Assistant Examiner*—Bumsuk Won
(74) *Attorney, Agent, or Firm*—Robert E. Bushnell, Esq.

(57) ABSTRACT

A plasma display module constructed with a chassis base; a plasma display panel supported by the chassis base in front of the chassis base to display an image; a circuit board on which a plurality of circuit devices that drive the plasma display panel are mounted, supported by the chassis base behind the chassis base; and a connection cable electrically connecting the circuit board and the plasma display panel, and directly grounded to the chassis base. Therefore, the module will be electrically stable when driven because of its grounding structure, and is suitable for providing images of high resolution.

17 Claims, 4 Drawing Sheets

FOREIGN PATENT DOCUMENTS

| | | |
|---|---|---|
| JP | 11-298094 | 10/1999 |
| JP | 2001-043804 | 2/2001 |
| JP | 3192144 | 5/2001 |
| JP | 2001-325888 | 11/2001 |
| JP | 2002-244568 | 8/2002 |
| JP | 2002-304125 | 10/2002 |

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

Japanese Office Action for corresponding Japanese Patent Application No. 2004-299027, issued on Jan. 30, 2007.

*Office Action* from the Chinese Patent Office issued in Applicant's corresponding Chinese Patent Application No. 2004-10092136.6 dated Feb. 22, 2008.

*Office Action* from the Chinese Patent Office issued in Applicant's corresponding Chinese Patent Application No. 200410092136.6 dated Aug. 22, 2008.

\* cited by examiner

PLASMA DISPLAY MODULE

CLAIM OF PRIORITY

This application makes reference to, incorporates the same herein, and claims all benefits accruing under 35 U.S.C. §119 from my application PLASMA DISPLAY MODULE filed with the Korean Intellectual Property Office on 16 Oct. 2003 and there duly assigned Ser. No. 2003-72148.

BACKGROUND OF THE INVENTION

1. Field of the Invention

The present invention relates to a plasma display module and, more particularly, to a plasma display module having an improved grounding structure.

2. Description of the Related Art

A plasma display module is a flat panel display module that displays images using a gas discharge phenomenon, and is highlighted as a next generation flat panel display module that can substitute for a cathode ray tube (CRT) because a plasma display module has excellent display characteristics such as display capacity, brightness, contrast, residual image, and wide viewing angle.

The plasma display module includes a plasma display panel (PDP), on which varying video images may be displayed, and a chassis base that is disposed to face the PDP.

The PDP is formed by combining a front panel and a back panel, and the front panel and the back panel respectively include a plurality of sustain electrode pairs and a plurality of address electrodes. In addition, discharge cells are disposed between the front panel and the back panel.

The plasma display module having the above described structure displays the images by selectively discharging the discharge cells. Thus, a circuit board, on which a circuit device that generates a control signal is mounted, is mounted on the chassis base. The signal generated by the circuit device is transmitted to an electrode of the panel through a connection cable, for example, a flexible printed circuit (FPC).

In order to apply an accurate driving signal stably to the panel electrode however, a reference voltage (that is, a voltage on a grounding line) should be constantly maintained in a circuit network that generates and transmits the signal as described above.

According to conventional practice in the art, the grounding line of the connection cable is electrically connected to a ground area of the circuit board, and the ground area of the circuit board is grounded to the chassis base, thus the connection cable is indirectly grounded to the chassis base through the circuit board.

Since the grounding of the connection cable is electrically connected through the circuit board however, the length of the reference voltage line increases, and accordingly, resistance of the line is increased and the line becomes vulnerable to noises generated in internal and external portions of the module. Thus, the reference voltage can not be constantly maintained. In addition, since the structure of grounding becomes more complex as the length of the reference voltage line is increased, the stability of the grounding is lowered and grounding defects may be created by external shock or vibration. More significantly, the structural dimensions of the discharge cell have become super-fine recently; thus, even more circuit devices and connection cables are mounted on the cell. We have found that, the grounding structure should therefore be improved.

SUMMARY OF THE INVENTION

It is therefore, an object of the present invention to provide a plasma display module having an improved grounding structure to be driven stably, and a improved process for constructing a plasma display module.

It is also an object to provide a plasma display module suitable for a high-definition image display, and an improved process for constructing a plasma display module.

According to one aspect of the present invention, there is provided a plasma display module constructed with a chassis base; a plasma display panel supported by the chassis base in front of the chassis base, for displaying variable video images, a circuit board on which are mounted a plurality of circuit devices that drive the plasma display panel to display the variable video images, supported by the chassis base behind the chassis base, and a connection cable that electrically connects the circuit board and the plasma display panel, and directly grounded to the chassis base.

The connection cable that connects the circuit board and the plasma display panel may be a flexible printed circuit.

A grounding line of the connection cable may be attached to the chassis base by a pressing unit.

A penetration hole may be formed on the connection cable, a coupling hole may be formed on the chassis base, and the pressing unit may be a coupler that is coupled to the coupling hole through the penetration hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
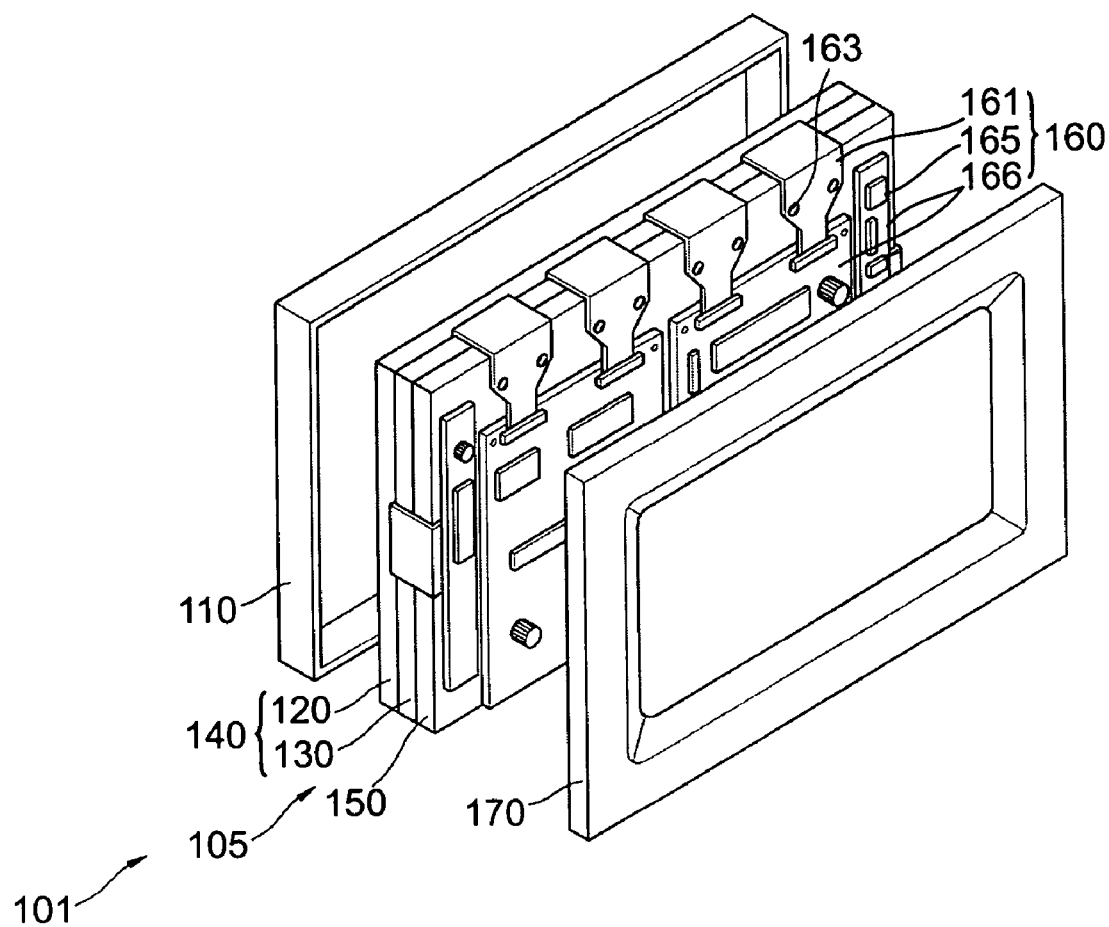
FIG. 1 is an exploded perspective view showing a plasma display apparatus including a plasma display module constructed according to the principles of the present invention as a first embodiment of the present invention.
Figure 2:
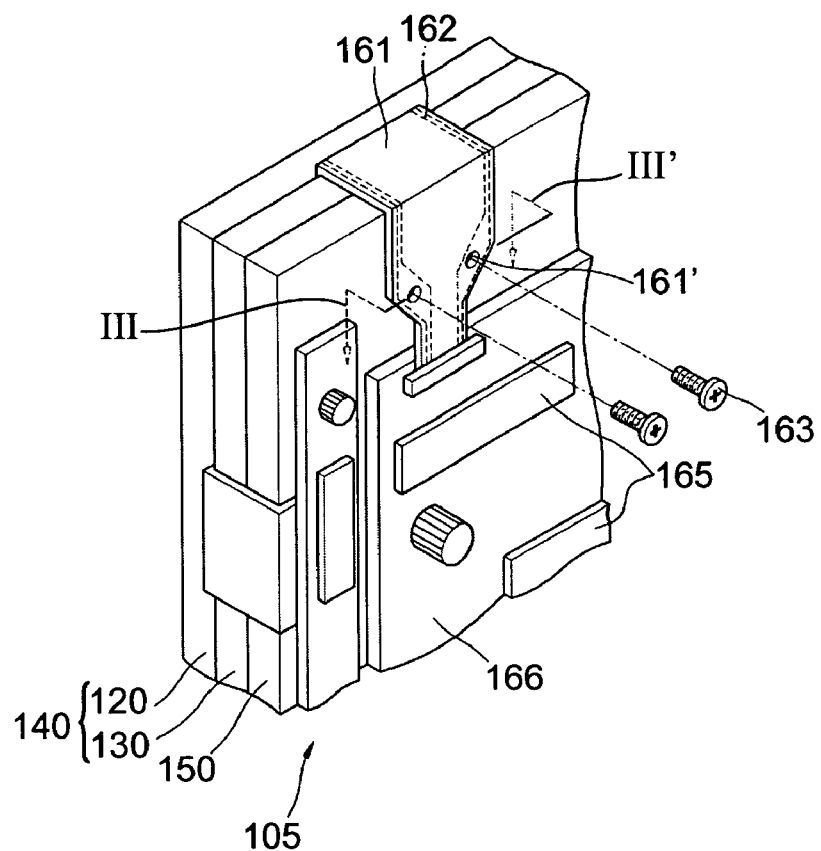
FIG. 2 is a perspective view showing a grounding structure of the plasma display module shown in FIG. 1.
Figure 3:
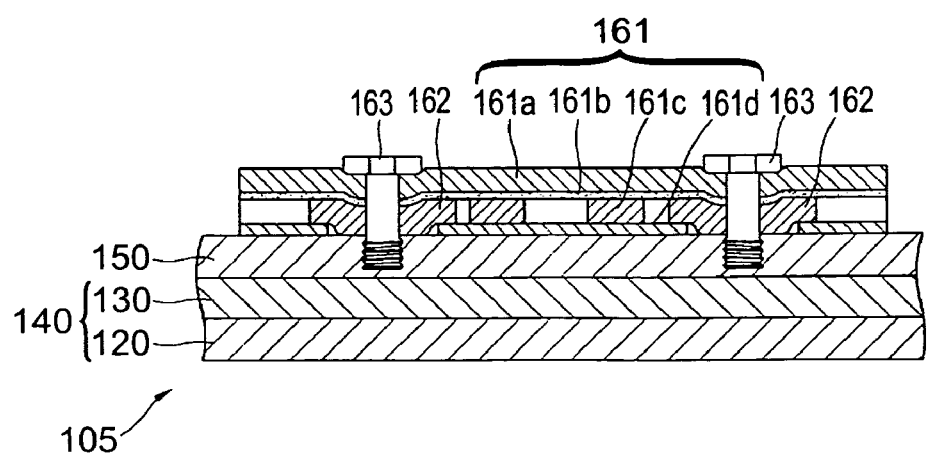
FIG. 3 is a cross-sectional view showing the plasma display module taken along line III-III' of FIG. 2.

FIG. 1 is an exploded perspective view showing a plasma display apparatus including a plasma display module according to the present invention, and FIG. 2 is a perspective view showing the plasma display module shown in FIG. 1. In addition, FIG. 3 is a cross-sectional view showing the plasma display module taken along line III-III' of FIG. 2.

Referring to FIG. 1 and FIG. 2 together, the plasma display module 105 of the present invention is surrounded by a front cabinet that forms bezel 110, and a back cover 170, to form a plasma display apparatus 101.

Plasma display module 105 includes a plasma display panel (PDP) 140, a chassis base 150, and a circuit unit 160. PDP 140 includes a front panel 120 and a back panel 130 that faces front panel 120. PDP 140 that is formed of a glass material that becomes an image display unit that forms an image through a discharge phenomenon, and a plurality of sustain electrode pairs (not shown) and a plurality of address electrodes (not shown) are respectively formed on the front panel 120 and the back panel 130 in a predetermined pattern. Signals are applied to these electrodes on front and back panels 120, 130 by electrical cable 161 connected to circuit board 166.

Chassis base 150 functions as a heat dissipation panel that enables the heat of PDP 140 and circuit unit 160 to be dissipated, and includes a large area that forms a reference voltage area. Thus, chassis base 150 is formed of a material which has a relative high thermal and electric conductivity, for example, aluminum. Chassis base 150 can be manufactured in a die-casting method or by a press method.

Circuit unit 160 is installed on a rear portion of chassis base 150 for driving PDP 140. Circuit unit 160 includes a circuit board 166, on which are mounted a plurality of electrical circuit, integrated circuits, chip sets, devices and components 165 that apply the controlled signals to the electrodes of PDP 140 together with various connection cables. Here, a flexible printed circuit can be used as connection cable 161 connecting the electrode of the panel to circuit board 166.

As shown in FIG. 3, connection cable 161 can be formed as a stacked body including a base film 161a, for example, a polyimide film, an adhesive layer 161b formed on a lower surface of the base film 161a, a copper layer 161c, on which a pattern is formed, and a solder resist (SR) layer 161d.

In the plasma display module 105 having the above described structure, a grounding line 162 of connection cable 161 that connects circuit board 166 and PDP 140 is directly grounded to chassis base 150. Referring to FIGS. 2 and 3, grounding line 162 formed along both sides of connection cable 161 can be formed to have large area for improving the stability of grounding.

In addition, as shown in FIG. 3, the protective layer such as the solder resist (i.e., "SR layer") layer 161d of connection cable 161 is not formed beneath grounding line 162, thus the underside of grounding line 162 is exposed to make electrical contact with base 150. Therefore, grounding line 162 is directly grounded to chassis base 150 through its exposed underside portion. Here, grounding line 162 is pressed into contact and held against chassis base 150 by pressing unit 163 such as a threaded fastener such as a bolt, and pressing unit 163 can be formed as a coupler, for example, a screw. In addition, a through hole 161' is formed which perforates connection cable 161, and a coupling hole (not shown) is formed into chassis base 150. Thus, pressing unit 163 can be coupled to the coupling hole through penetration hole 161' hold grounding line 162 in continuous electrical contact with chassis base 150.

As shown in FIG. 2, if penetration hole 161' through connection cable 161 is formed through grounding line 162, grounding line 162 that is pressed by pressing unit 163 can effectively form an electrical contact with chassis base 150.

As described above, since grounding line 162 of connection cable 161 is directly grounded to chassis base 150, the voltage variance in magnitude of voltage that would otherwise be caused by the resistance of the reference voltage line and noise affect caused by electromagnetic waves that are generated on internal and external portions of the module can be reduced. Thus, the reference voltage can be maintained constantly. Moreover, accurate signals can be stably applied to the electrodes of panel 140, and the desired images may be displayed accurately.

In addition, since grounding line 162 of connection cable 161 is directly grounded to chassis base 150 without passing through circuit board 166, the stability of the grounding can be improved, and module 105 can be driven stably regardless of the external shock or vibration.

In the drawings, grounding line 162 is formed along both sides of connection cable 161; however, the position where grounding line 162 may be formed is not limited to foregoing embodiments.

Figure 4:
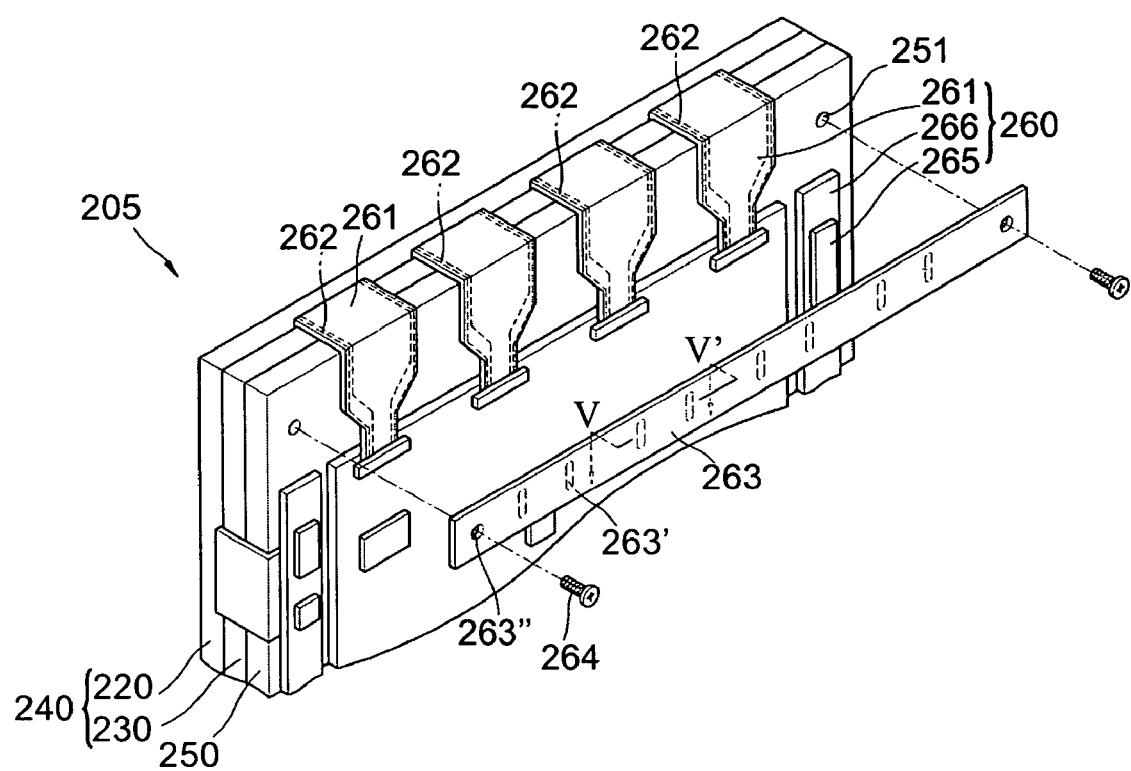
FIG. 4 is a perspective view showing a plasma display module constructed as a second embodiment of the present invention.
Figure 5:
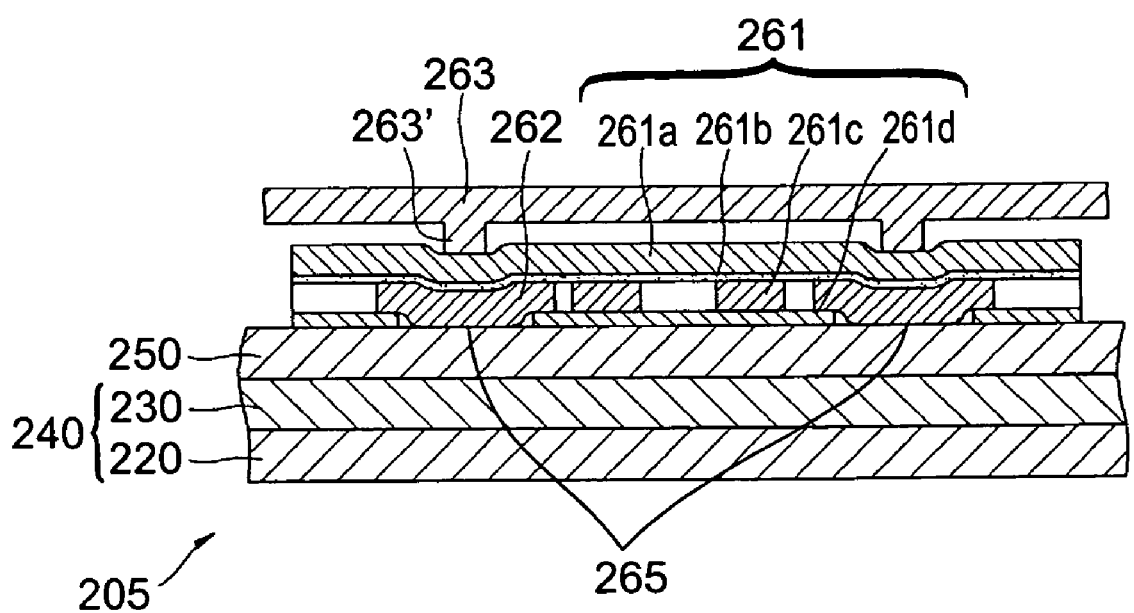
FIG. 5 is a cross-sectional view showing the plasma display module taken along line V-V' of FIG. 4.

FIG. 4 is a perspective view showing a plasma display module constructed as another embodiment of the present invention, and FIG. 5 is a cross-sectional view showing the plasma display module taken along line V-V' of FIG. 4. The plasma display module 105 includes the same elements performing the same functions as those of the first embodiment, except for the following technical features, which will be described later.

Referring to FIGS. 4 and 5 collectively, a grounding line 262 formed on both sides of a connection cable 261 is directly grounded to chassis base 250 through an exposed portion. Here, connection cable 261 and chassis base 250 are held pressed in contact against each other by pressing unit 263, and pressing unit 263 can be formed as a plate of an electrically conducting material including a plurality of protrusions 263'. Protrusions 263' are formed on a part located in corresponding alignment with grounding line 262 to press grounding line 262 effectively toward chassis base 250.

In addition, as shown in FIG. 4, pressing unit 263 can extend to press a plurality of connection cables 261 positioned in a spaced-apart array, at the same time. Pressing unit 263 can be coupled to chassis base 150 by screw 264 that is coupled to a coupling hole 251 through hole 263" that passes through both sides of unit 263. Consequently, during manufacture, each connection cable 261 may be one of a plurality of connecting cables 261, each bearing a corresponding grounding lead 262. A structural member such as elongate bar 263 may be installed across chassis base 250 with structural member 263 bearing a plurality of spaced-apart bosses 263' aligned with each area 265 of electrical contract between each of the plurality of grounding leads 261d and chassis base 250, with structural member 263 maintaining each of grounding leads 261d in continuous electrical contact with chassis base 250.

If the grounding structure described above is used, there is no need to form penetration hole 161' (shown in FIG. 2) in connection cable 261, and the number of process steps for a coupling operation may be reduced, thereby improving workability and an efficiency of manufacturing the panel.

In addition, a plasma display panel 240 including a front panel 220 and a back panel 230, a circuit unit 260 including a circuit device 265 and a circuit board 266, and a connection cable 261 including a base film 261a, an adhesive layer 261b, a copper layer 261c, and an solder resist layer 261d may be the same elements as those used in the construction of the above first embodiment.

In the plasma display module, a driving device that applies the signals to the electrodes of the panel can be directly mounted on the connection cable, and the technical features of the present invention can be applied to that structural configuration.

According to the plasma display module of the present invention, since the grounding line of the connection cable that connects the circuit board and the panel electrodes is directly grounded to the chassis base, the line resistance that is caused by the increasing length of the reference voltage line, as well as the noise generated in internal and external portions of the module can be reduced, thereby maintaining the reference voltage substantially constant in magnitude.

In addition, the stability of the grounding can be improved by simplifying the grounding structure, thus the grounding defects that may be caused by external shock or vibration of plasma display module 105, 205 can be prevented. Therefore, accurate signals can be stably applied to the electrodes of the panel, and the desired image can be realized stably.

Especially, with the plasma display modules of the present invention, since electrical grounding is made stable, various circuit devices and connection cables can operate reliably, and accordingly, the plasma display module can be suitable to provide images of high resolution and high quality.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A plasma display module comprising:
    a chassis base;
    a plasma display panel supported by the chassis base in front of the chassis base, and displaying an image;
    a circuit board, on which a plurality of circuit devices that drive the plasma display panel are mounted, supported by the chassis base and arranged behind the chassis base; and
    a connection cable electrically connecting the circuit board and the plasma display panel, and directly grounded to the chassis base, the connection cable including a conductive layer interposed between a base film and a protective layer, a portion of either the base film or the protective layer having an aperture therein, and a grounding line directly contacting the chassis base through the aperture.

2. The plasma display module of claim 1, wherein the connection cable that connects the circuit board and the plasma display panel is a flexible printed circuit.

3. The plasma display module of claim 1, wherein the grounding line of the connection cable is adhered to the chassis base by a pressing unit.

4. The plasma display module of claim 3, wherein a penetration hole is formed on the connection cable, a coupling hole is formed on the chassis base, and the pressing unit is a coupler that is coupled to the coupling hole through the penetration hole.

5. The plasma display module of claim 3, wherein the pressing unit is a plate material, on which a protrusion is formed.

6. A plasma display module, comprising:
    a plasma display panel bearing a front side disposed to display varying visual images;
    a circuit board mounting a circuit to operationally drive said plasma display panel to display the images;
    a chassis base retentively interposed between a back side of said plasma display panel and said circuit board; and
    a connection cable extending between and operationally coupling said plasma display panel and said circuit mounted on said circuit board, while concurrently presenting an electrically conducting grounding line to an electrically conducting area of said chassis base and an electrical grounding pad on said circuit board, the connection cable including a conductive layer interposed between a base film and a protective layer, a portion of either the base film or the protective layer having an aperture therein, and the electrically conducting grounding line directly contacting the chassis base through the aperture.

7. The plasma display module of claim 6, with said cable comprising a flexible printed circuit.

8. The plasma display module of claim 6, further comprising a structural member maintaining said grounding line in continuous electrical contact with said chassis base.

9. The plasma display panel of claim 6, further comprised of:
    a plurality of said connecting cables including said connection cable, each connecting cable bearing a corresponding said grounding line; and
    a structural member bearing a plurality of spaced-apart bosses aligned with each area of electrical contact between a plurality of grounding lines and said chassis base, with said structural member maintaining each of said grounding lines in continuous electrical contact with said chassis base.

10. The plasma display module of claim 6, further comprising a threaded fastener maintaining said grounding line in continuous electrical contact with said chassis base.

11. A process of constructing a plasma display module, comprising the steps of:
    disposing a plasma display panel bearing a front side to display varying visual images;
    mounting a circuit board bearing a circuit to operationally drive said plasma display panel to display the images;
    retentively interposing a chassis base between a back side of said plasma display panel and said circuit board; and
    extending a connection cable between and operationally coupling said plasma display panel and said circuit mounted on said circuit board, while concurrently presenting an electrically conducting grounding line to an electrically conducting area of said chassis base and an electrical grounding pad on said circuit board, the connection cable including a conductive layer interposed between a base film and a protective layer, a portion of either the base film or the protective layer having an aperture therein, and the electrically conducting grounding line directly contacting the chassis base through the aperture.

12. The process of claim 11, comprised of forming said connection cable with a flexible printed circuit.

13. The process of claim 11, further comprised of installing a structural member on said chassis base, with said structural member maintaining said grounding line in continuous electrical contact with said chassis base.

14. The process of claim 11, further comprised of installing a structural member bearing a boss aligned with an area of electrical contact between said grounding line and said chassis base, with said structural member maintaining said grounding line in continuous electrical contact with said chassis base.

15. The process of claim 11, further comprised of installing a structural member bearing a plurality of bosses aligned with each area of electrical contact between a plurality of grounding lines and said chassis base, with said structural member maintaining each of said grounding lines in continuous electrical contact with said chassis base.

16. The process of claim 11, further comprised of:
    a plurality of said connecting cables including said connection cable, each connecting cable bearing a corresponding said grounding line; and
    installing across said chassis base a structural member bearing a plurality of spaced-apart bosses aligned with each area of electrical contact between a plurality of grounding lines and said chassis base, with said structural member maintaining each of said grounding lines in continuous electrical contact with said chassis base.

17. The process of claim 11, further comprised of installing a threaded fastener on said chassis base, with said threaded fastener maintaining said grounding line in continuous electrical contact with said chassis base.

* * * * *